(12) United States Patent
Mathew et al.

(10) Patent No.: US 7,397,090 B2
(45) Date of Patent: Jul. 8, 2008

(54) GATE ELECTRODE ARCHITECTURE FOR IMPROVED WORK FUNCTION TUNING AND METHOD OF MANUFACTURE

(75) Inventors: Shajan Mathew, Singapore (SG); Lakshmi Kanta Bera, Singapore (SG); Narayanan Balasubramanian, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 419 days.

(21) Appl. No.: 11/160,126

(22) Filed: Jun. 9, 2005

(65) Prior Publication Data

US 2005/0275035 A1 Dec. 15, 2005

Related U.S. Application Data

(60) Provisional application No. 60/521,649, filed on Jun. 10, 2004.

(51) Int. Cl.
*H01L 29/76* (2006.01)
(52) U.S. Cl. .................. 257/369; 257/407; 257/412
(58) Field of Classification Search ................. 257/407, 257/412, 369, 390
See application file for complete search history.

(56) References Cited

U.S. PATENT DOCUMENTS

| | | | |
|---|---|---|---|
| 6,291,282 B1 | 9/2001 | Wilk et al. | |
| 6,373,111 B1 * | 4/2002 | Zheng et al. | 257/407 |
| 6,458,695 B1 | 10/2002 | Lin et al. | |
| 6,492,217 B1 | 12/2002 | Bai et al. | |
| 6,514,827 B2 | 2/2003 | Kim et al. | |
| 6,545,324 B2 | 4/2003 | Madhukar et al. | |
| 6,809,394 B1 * | 10/2004 | Visokay | 257/500 |
| 2002/0151125 A1 * | 10/2002 | Kim et al. | 438/199 |
| 2005/0258468 A1 * | 11/2005 | Colombo et al. | 257/314 |

OTHER PUBLICATIONS

"The Work Function of the Elements and its Periodicity," H. B. Michaelson, Journal of Applied Physics, vol. 48, No. 11, pp. 4729-4733, Nov. 1977.
"Tunable Work Function Dual Metal Gate Technology for Bulk and Non-Bulk CMOS," J. Lee et al., Int. Elec. Dev. Mtg., pp. 359-362, 2000.
"Tunable Work Function Molybdenum Gate Technology for FDSOI-CMOS." P. Rande et al., Int. Elec. Dev. Mtg., pp. 363-366, 2000.
"Dual Work Function Metal Gate CMOS Technology Using Metal Interdiffusion," I. Polishchuk et al., IEEE Electron Device Letters, vol. 22, No. 9, pp. 444-446, Sep. 2001.
"Wide Range Work Function Modulation of Binary Alloys for MOSFET Application," B. Tsui et al., IEEE Electron Device Letters, vol. 24, No. 3, pp. 153-155, Mar. 2003.

* cited by examiner

*Primary Examiner*—Tuan H Nguyen

(57) ABSTRACT

A method of forming gate electrodes having different work functions includes forming a first well of a first conductivity type and a second well of a second conductivity type. Subsequently, a gate dielectric layer is deposited over the first and second wells. A multi-layer stack comprising two or more thin metal/metal nitride layers is next formed over the first well. A thick metal/metal nitride layer is formed over the multi-layer stack to form the first gate electrode. The thick metal/metal nitride layer is also formed over the gate dielectric layer portion extending over the second well, thereby forming the second gate electrode. The first and second electrodes are then annealed, and thereafter exhibit different work functions as desired.

8 Claims, 6 Drawing Sheets

US 7,397,090 B2

GATE ELECTRODE ARCHITECTURE FOR IMPROVED WORK FUNCTION TUNING AND METHOD OF MANUFACTURE

CROSS REFERENCE TO RELATED APPLICATIONS

This application claims the benefit of U.S. Provisional Application No. 60/521,649, filed Jun. 10, 2004, the contents of which are hereby incorporated by reference in its entirety for all purposes.

BACKGROUND

The present invention relates to semiconductor devices and fabrication processes, and more specifically to semiconductor gate electrode architectures which provide improved work function tuning.

In the conventional CMOS process, poly silicon is used as a gate electrode material up to 90 nm node. The conventional process has several advantages such as: (i) it is compatible with high temperature processing, (ii) well behaved poly-Si/thermal $SiO_2$ interfaces, (iii) more reliable than metal gate electrode like Al, (iv) conformal deposition over steep topography (v) and most significantly it introduces self-aligned dual work function for both n-MOSFETs and p-MOSFETs by selection of proper dopant.

The polysilicon gate electrode, however, also represents a major challenge for near-term and long-term CMOS scaling. Some major limitations of the process include gate depletion, high gate resistance and boron penetration into the channel region. The poly depletion causes an effective increase in the gate dielectric thickness, which operates to reduce the current drive. Boron diffusion from p+ polysilicon gate to the channel degrades device performance significantly. Both the effective increase in the gate dielectric thickness associated with depletion and the channel autodoping associated with boron out-diffusion from the p+ polysilicon gate will eventually require the phase-out of polysilicon as gate material beyond the 45 nm technology node.

Metal gate electrodes offer a potential solution to the aforementioned problem. Metal gate electrodes provide advantages such as: (i) no boron penetration from polysilicon gate into channel through very thin gate dielectric, (ii) much lower gate resistance, (iii) and perhaps the most desirable advantage of reduced electrical thickness of gate dielectric. The last and most significant advantage is derived through elimination of depletion in heavily doped polysilicon gates, which can amount to a 3-5 Å reduction in equivalent oxide thickness (EOT)—the equivalent of ~2 generation advancement.

A key requirement for gate electrode material in CMOS is that of dual work function. Gate metal for NMOS and PMOS devices should have work functions which closely correspond to conduction and valence band edge respectively for surface channel mode of operation. In conventionally fabricated CMOS devices, the dual work function of the polysilicon gate is achieved by implanting the polysilicon material with either n or p-type dopants (during deep S/D implantation) as mentioned above.

In the case of refractory metals or metal nitrides, work function is not a strong function of doping, and S/D implantation cannot be used for work function tuning. Further, conventional approaches of using two different bulk metals to fabricate NMOS and PMOS gate electrodes require the use of exotic metals and alloys to meet the work function requirements, which complicates CMOS processing and results in lower device yield.

What is needed is a gate electrode architecture capable of a dual work function, and which can be preferably fabricated using technology close to conventional CMOS fabrication.

SUMMARY

A method of forming gate electrodes having different work functions includes forming a first well of a first conductivity type and a second well of a second conductivity type. Subsequently, a gate dielectric layer is deposited over at least a portion of the first and second wells. A multi-layer stack comprising two or more thin metal/metal nitride layers is next formed over the first well. A thick metal/metal nitride layer is formed over the multi-layer stack to form the first gate electrode. The thick metal/metal nitride layer is also formed over the gate dielectric layer portion extending over the second well, thereby forming the second gate electrode. The first and second electrodes are then annealed, and thereafter exhibit different work functions as desired.

DETAILED DESCRIPTION

Figure 1A:
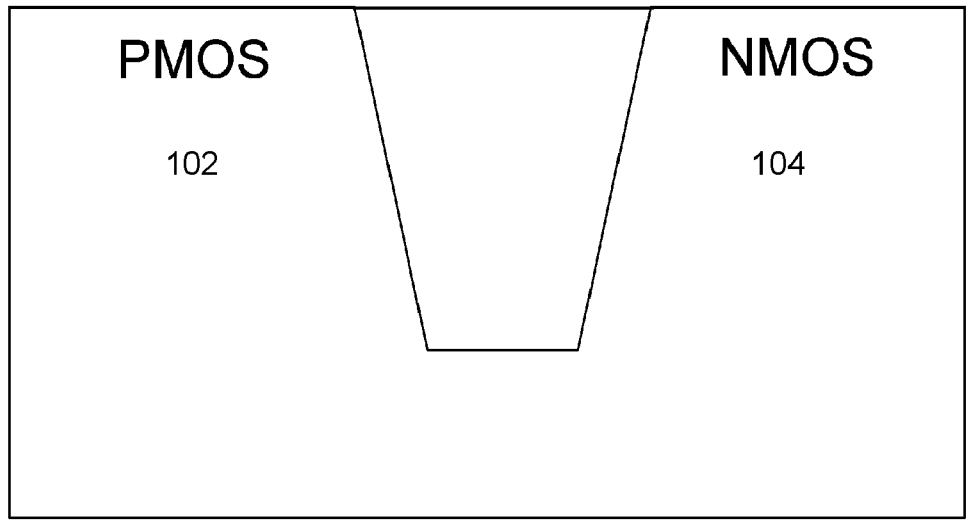
FIGS. 1A-1G illustrate the processes for fabricating the gate electrode in accordance with one embodiment of the present invention.
Figure 1B:
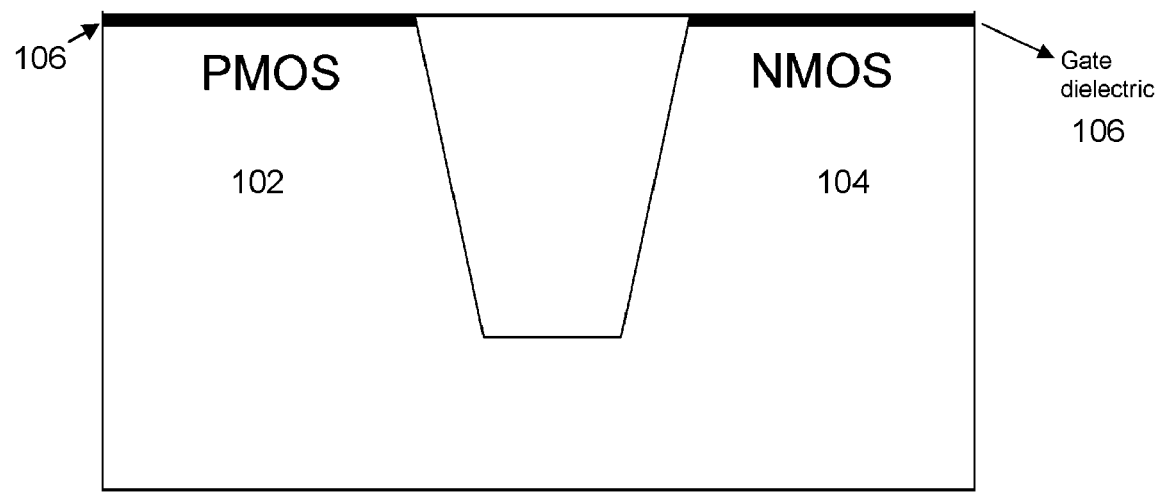
Figure 1C:
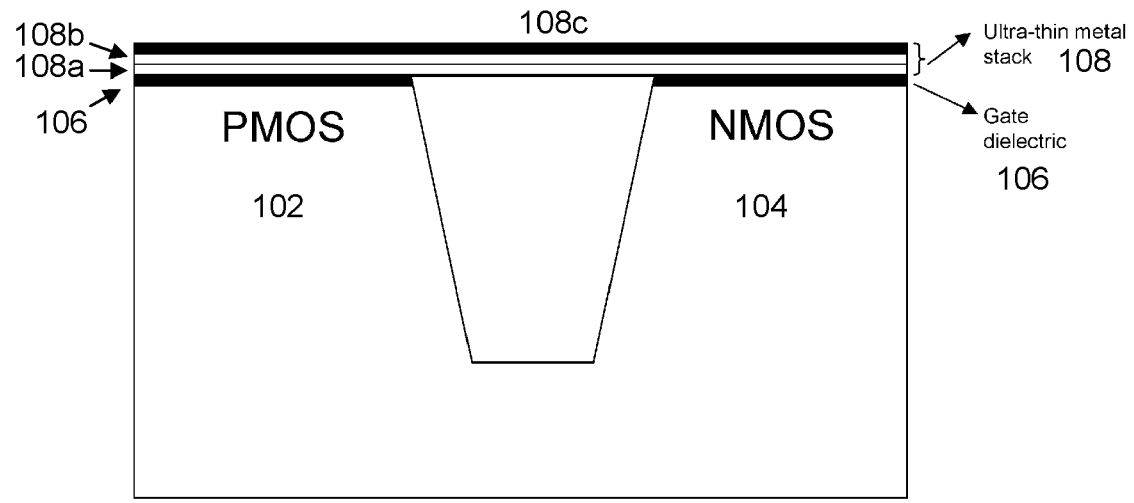
Figure 1D:
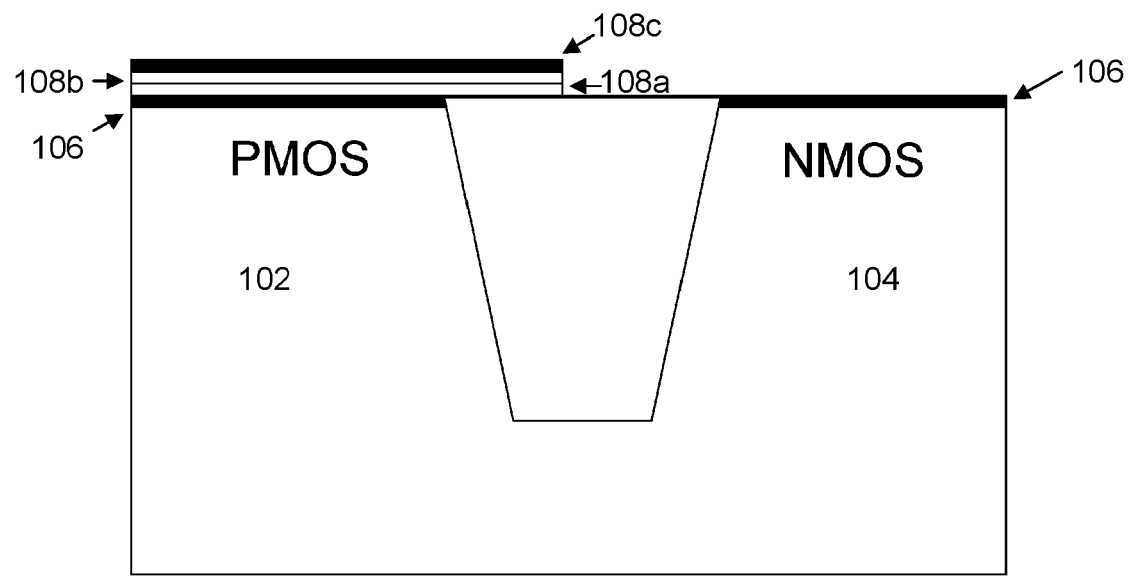
Figure 1E:
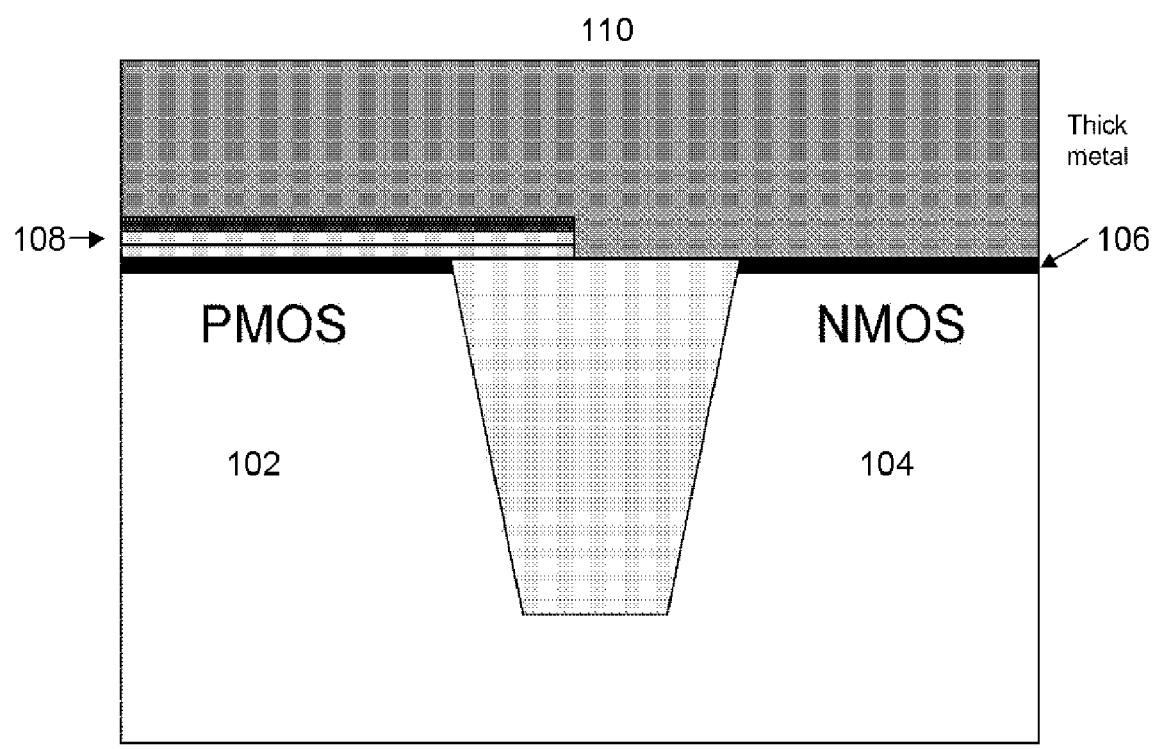
Figure 1F:
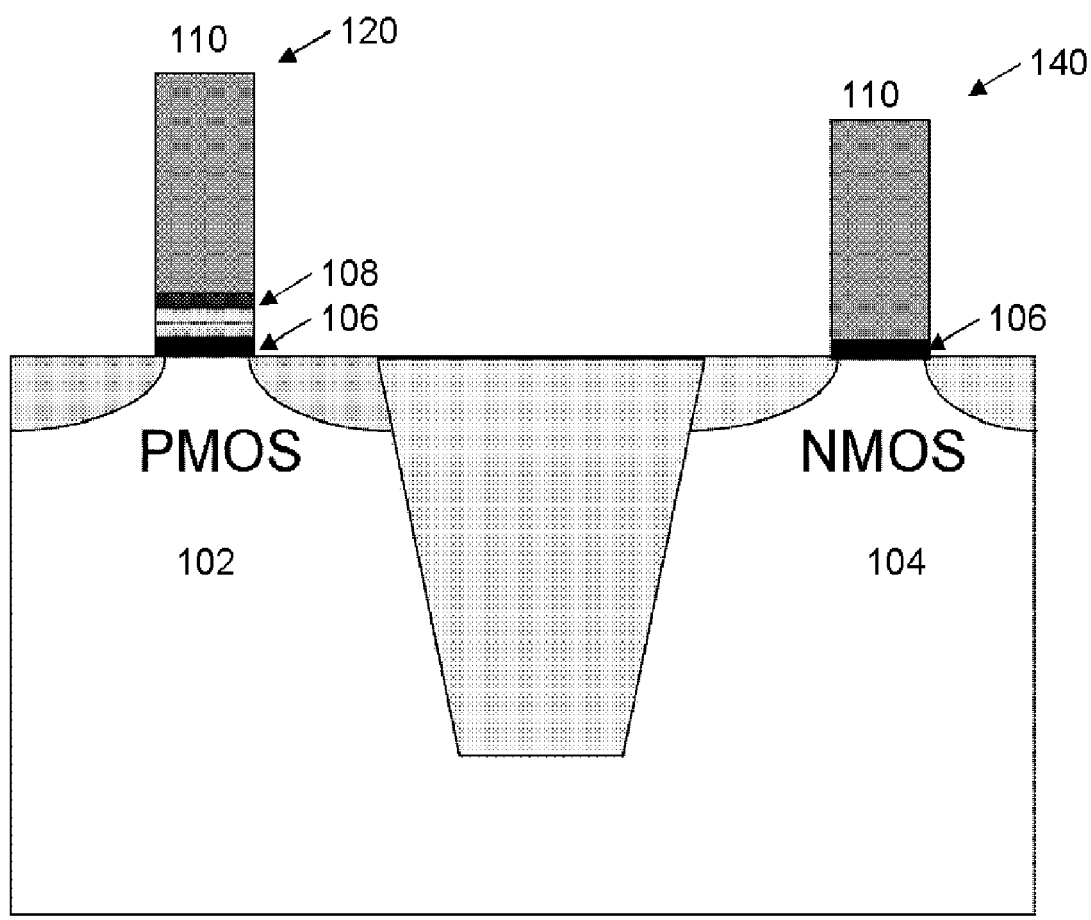
Figure 1G:
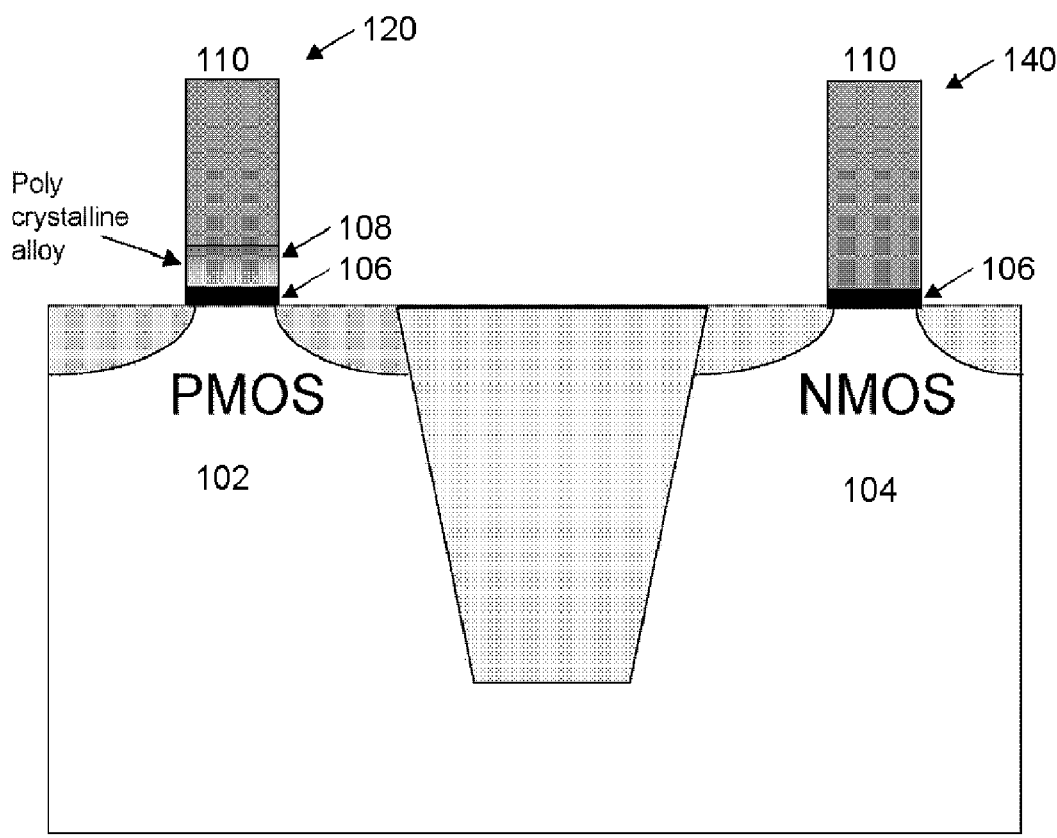

The present invention provides a gate electrode architecture which possesses a dual work function capability and which can be either fabricated using conventional CMOS technology or more futuristic replacement gate approach.

FIGS. 1A-1G illustrate the processes for fabricating the gate electrode architecture in accordance with one embodiment of the present invention. Initially, the well/channel implants 102 (for p-MOS) and 104 (for n-MOS) and isolation steps for both device types are performed, preferably in accordance with conventional CMOS processing. Next, a suitable gate dielectric layer 106 is grown/deposited over the active area (Silicon). The gate dielectric layer 106 may comprise silicon dioxide, silicon nitride, an oxynitride, a silicate, or a high-k material (e.g., hafnium oxide, Hf $SiO_xN_y$, aluminum oxide, BST, tantalum pentoxide, or other suitable material).

Next, two or more thin (10-100 Å) metal (or metal nitride) layers are deposited over the gate dielectric layer of one of the device types 102, forming a multi-layer stack 108. Three metal/metal nitride layers 108a-108c form the stack 108 in the illustrated embodiment, although in other embodiments, two layers may be used, as well as four or more layers. In the preferred embodiment, at least one of the layers is of a different metal/metal nitride type than one of the other layers. In a further specific embodiment, each of the layers comprises a different metal/metal nitride type. For example, layers consisting of Ti, Ta, Hf, Nb, Mo, Zr, or W metals/metal nitrides may be used to form the stack 108. These materials are only exemplary, and those skilled in the art will appreciate that many other conventional thin metals used in the CMOS fabrication process may be used as well. Each layer's composition and deposition order in the stack 108 is carefully selected in order to produce the final work function requirement of the device type 102, as will be further described below.

Next, mask and etch processes are used to remove the multi-layer stack 108 from the area of the second device type 104, a process which is preferably performed using any of the conventional CMOS techniques. Subsequently, a thick metal/metal nitride layer 110 is deposited. This thick metal/metal nitride layer 110 may comprise any conventional thick metal/metal nitride films, or alternatively may consist of one of the types used in the multi-layer stack 108. The thick metal/metal nitride is selected such that it exhibits the desired work function for the second device type 104 (n-MOS). At the conclusion of the fabrication process, the gate electrode 120 for the first device type includes a thick metal/metal nitride layer 110 disposed over a stack of two or more thin metal/metal nitride layers 108a-c, which is disposed over the gate dielectric layer 106. The gate electrode 140 for the second device type comprises a thick metal/metal nitride layer 110 deposited over the gate dielectric layer 106.

Prior to annealing, the thin metal/metal nitride layers 108a-c will typically have an amorphous structure, where as the thick metal/metal nitride layer 110 will typically be in poly crystalline form. As is known in the art [H. B. Michaelson, J. Appl. Phys. 48, p 4729, 1977, incorporated herein by reference], a change of phase or orientation is known to affect the work function of conducting films. Materials with smaller grain sizes have more grain boundaries and exhibit higher work function values due to the grain boundary effect. In the present case, having 3 metals in the stack impedes with the grain growth during alloying at high temperature and that can result in too many but smaller grains. It is further known that the thin metal/metal nitride layers 108a-c will become intermixed during annealing, such intermixing contributing to work function change [I. Polishchuk et al, IEEE EDL 23, p 200, 2002, incorporated herein by reference]. Accordingly, thermal annealing is used in the present invention to promote phase change and intermixing in the thin layers 108a-c. Thus by selecting the composition and number of the thin layers 108a-c, and the annealing temperature, the desired work function can be obtained.

Figure 2A:
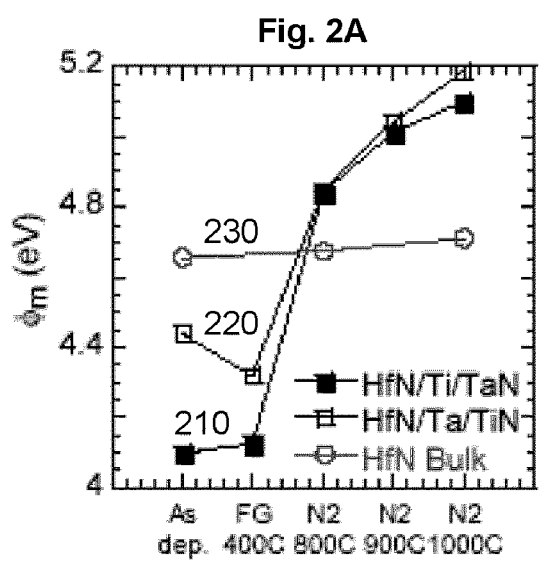
FIGS. 2A-2C illustrate a working function $\phi m$ of gate electrodes as a function of annealing temperature for exemplary Hf, Ti, and Ta materials For clarity, previously identified features retain their reference indicia in subsequent drawings.
Figure 2B:
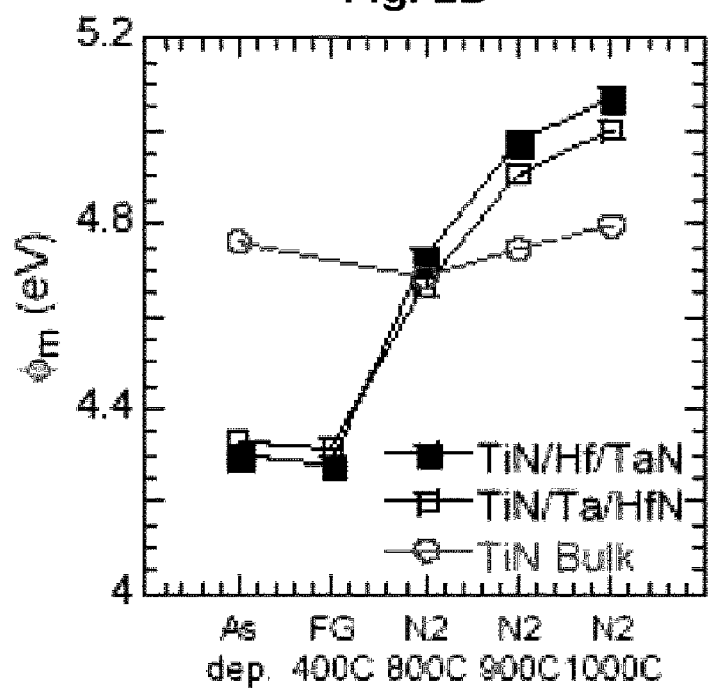
Figure 2C:
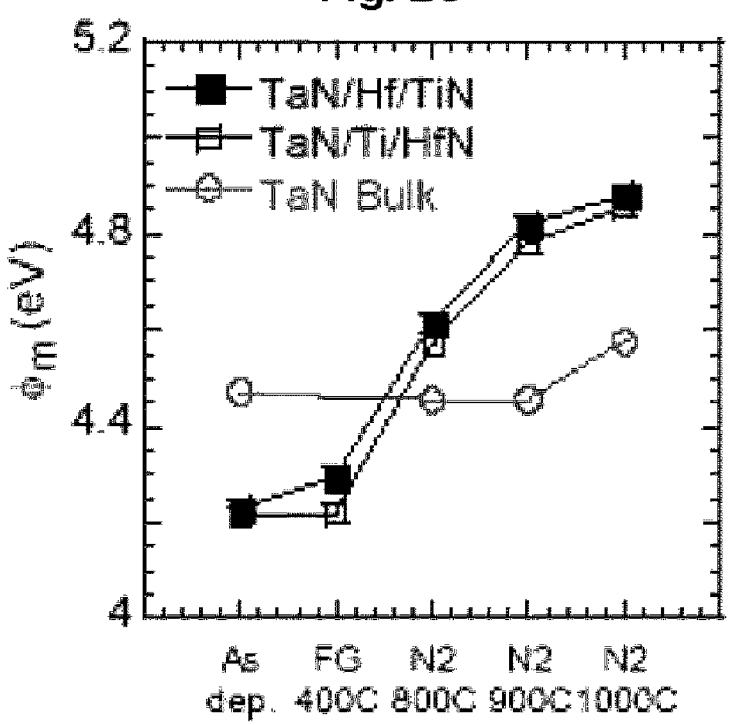

FIGS. 2A-2C illustrate the work function ($\phi m$) of gate electrodes 120 and 140 as a function of annealing temperature for exemplary Hf, Ti and Ta materials. Referring to FIG. 2A, three work function responses are shown, two responses (210 and 220) showing the work function of gate electrode 120 for two different multi-layer stack compositions, and a third response (230) for gate electrode 140 which comprises bulk HfN material. Response 210 shows the work function of gate electrode 120 versus annealing temperature for a multi-layer stack of HfN—Ti—TaN layers, and response 220 for a multi-layer stack of HfN—Ta—TiN. FIGS. 2B and 2C illustrate similar responses for the different compositions of the multi-layer stack 108 and the thick metal/metal nitride layer 110, as shown.

As can be observed from FIGS. 2A-2C, the working function of gate electrode 120 comprising the multi-layer Hf, Ti and Ta stacks can be adjusted over a range of approximately 1 eV based upon the annealing temperature chosen. The work function for the gate electrode 140 comprising the bulk Hf, Ti and Ta polycrystalline thick metal layer does not change significantly after annealing. In this manner, fabrication of gate electrodes having substantially different work functions is realizable using the processes of the present invention.

As readily appreciated by those skilled in the art, the described processes may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer of other such programmable device to carry out the intended functions.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A semiconductor device having a first well of a first conductivity type and a second well of a second conductivity type, the semiconductor device comprising:
   a gate dielectric layer extending over at least a portion of the first well and the second well;
   a first gate electrode disposed on the gate dielectric layer and extending over the first well, the first gate electrode comprising a multi-layer stack, comprising:
      (i) a first thin metal/metal nitride layer disposed on the gate dielectric layer;
      (ii) a second thin metal/metal nitride layer disposed on the first thin metal/metal nitride layer;
      (iii) a third thin metal/metal nitride layer disposed on the second thin metal/metal nitride layer; and
      (iv) a first thick metal/metal nitride layer disposed on the third thin metal/metal nitride layer
   a first source electrode and a first drain electrode formed in the first well adjacent to the first gate electrode;
   a second gate electrode disposed on the gate dielectric layer and extending over the second well, the second gate electrode comprising a portion of the first thick metal/metal nitride layer; and
   a second source electrode and a second drain electrode formed in the second well adjacent to the second gate electrode,
   wherein the first, second, and third thin metal/metal nitride layers are of an amorphous form and the first thick metal/metal nitride layer is of a polycrystalline form.

2. The semiconductor device of claim 1, wherein, after annealing, the multi-layer stack comprises a first work function voltage, and after annealing, the annealed thick metal/metal nitride layer comprises a second, different work function voltage.

3. The semiconductor of claim 1, wherein the thickness of each of the first, second, and third thin metal/metal nitride layers is 10-100 Angstroms.

4. The semiconductor device of claim 1, wherein at least one of the first, second, or third thin metal/metal nitride layers is composed of a material which is different from the other of the first, second, or third thin metal/metal nitride layers.

5. The semiconductor device of claim 1, wherein each of the first, second and third thin metal/metal nitride layers is composed of a different material.

6. A semiconductor device having a first well of a first conductivity type and a second well of a second conductivity type, the semiconductor device comprising:
   gate dielectric layer means extending over at least a portion of the first well and the second well;

first gate electrode means disposed on the gate dielectric layer means and extending over the first well, the first gate electrode means comprising a multi-layer stack, comprising:
(i) a first thin metal/metal nitride layer disposed on the gate dielectric layer;
(ii) a second thin metal/metal nitride layer disposed on the first thin metal/metal nitride layer;
(iii) a third thin metal/metal nitride layer disposed on the second thin metal/metal nitride layer; and
(iv) a first thick metal/metal nitride layer disposed on the third thin metal/metal nitride layer first source electrode means and first drain electrode means formed in the first well adjacent to the first gate electrode means;

second gate electrode means disposed on the gate dielectric layer and extending over the second well, the second gate electrode means comprising a portion of the first thick metal/metal nitride layer; and second source electrode means and second drain electrode means formed in the second well adjacent to the second gate electrode means, wherein the first, second, and third thin metal/metal nitride layers are of an amorphous form and the first thick metal/metal nitride layer is of a polycrystalline form.

7. The semiconductor device of claim 6, wherein at least one of the first, second, or third thin metal/metal nitride layers is composed of a material which is different from the other of the first, second, or third thin metal/metal nitride layers.

8. The semiconductor device of claim 6, wherein each of the first, second and third thin metal/metal nitride layers is composed of a different material.

* * * * *